United States Patent
Hong et al.

(10) Patent No.: US 7,888,798 B2
(45) Date of Patent: Feb. 15, 2011

(54) SEMICONDUCTOR DEVICES INCLUDING INTERLAYER CONDUCTIVE CONTACTS AND METHODS OF FORMING THE SAME

(75) Inventors: Jongwon Hong, Hwaseong-si (KR); GeumJung Seong, Seoul (KR); Jongmyeong Lee, Seongnam-si (KR); Hyunbae Lee, Seoul (KR); Bonghyun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 12/080,284

(22) Filed: Apr. 2, 2008

(65) Prior Publication Data

US 2008/0284006 A1      Nov. 20, 2008

(30) Foreign Application Priority Data

May 16, 2007   (KR) .................. 10-2007-0047712
Jul. 18, 2007   (KR) .................. 10-2007-0071781

(51) Int. Cl.
H01L 23/48      (2006.01)
H01L 23/52      (2006.01)
H01L 29/40      (2006.01)

(52) U.S. Cl. ............... 257/734; 438/689; 257/E23.019

(58) Field of Classification Search ............. 257/734, 257/773, E23.019; 438/689, 697
See application file for complete search history.

(56) References Cited

U.S. PATENT DOCUMENTS 6,251,790 B1   6/2001   Jeong

2005/0064660 A1 * 3/2005 Oh et al. ............... 438/239
2005/0191851 A1 * 9/2005 Liu et al. ............... 438/634
2005/0287803 A1   12/2005 Lee
2006/0170107 A1 * 8/2006 Park .................... 257/773
2006/0178002 A1   8/2006 Kim et al.

FOREIGN PATENT DOCUMENTS

JP    11-067902         3/1999
KR    10-2006-0000299   1/2006
KR    10-2006-0074346   3/2006

* cited by examiner

*Primary Examiner*—Chuong A Luu
*Assistant Examiner*—Nga Doan
(74) *Attorney, Agent, or Firm*—Mills & Onello, LLP

(57) ABSTRACT

In a semiconductor device and a method of forming the same, the semiconductor device comprises: a first insulating layer on an underlying contact region of the semiconductor device, the first insulating layer having an upper surface; a first conductive pattern in a first opening through the first insulating layer, an upper portion of the first conductive pattern being of a first width, an upper surface of the first conductive pattern being recessed relative to the upper surface of the first insulating layer so that the upper surface of the first conductive pattern has a height relative to the underlying contact region that is less than a height of the upper surface of the first insulating layer relative to the underlying contact region; and a second conductive pattern contacting the upper surface of the first conductive pattern, a lower portion of the second conductive pattern being of a second width that is less than the first width.

22 Claims, 19 Drawing Sheets

Fig. 7A'
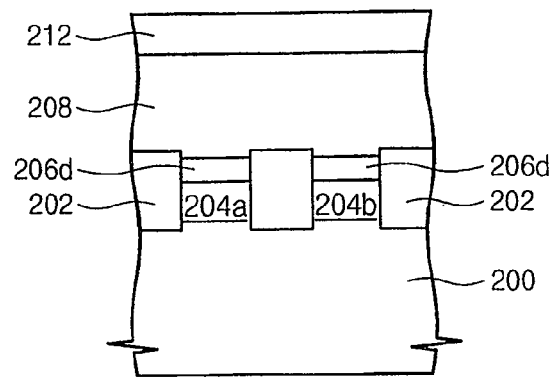
Fig. 7A"
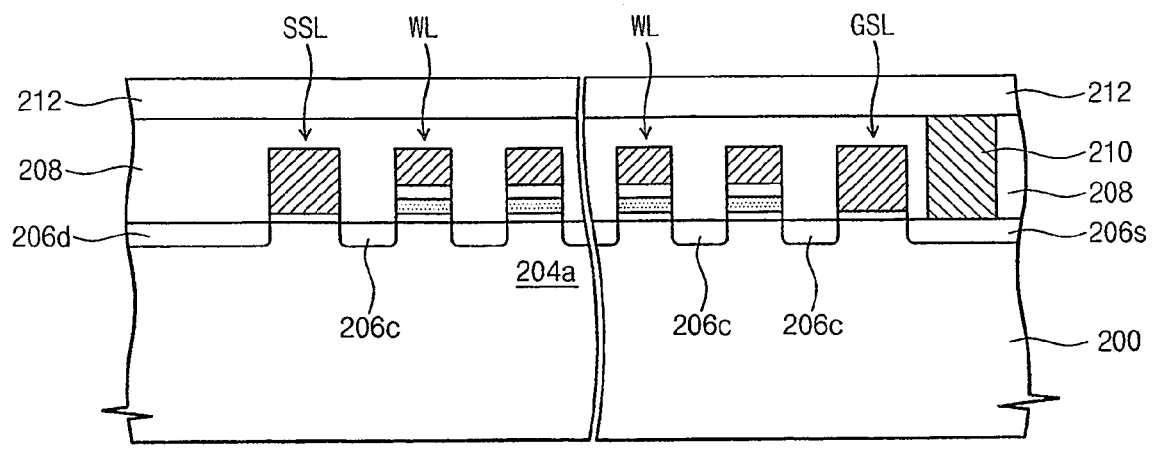

Fig. 7B'
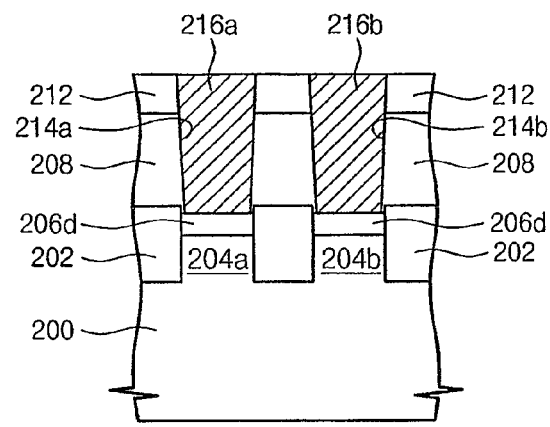
Fig. 7B"
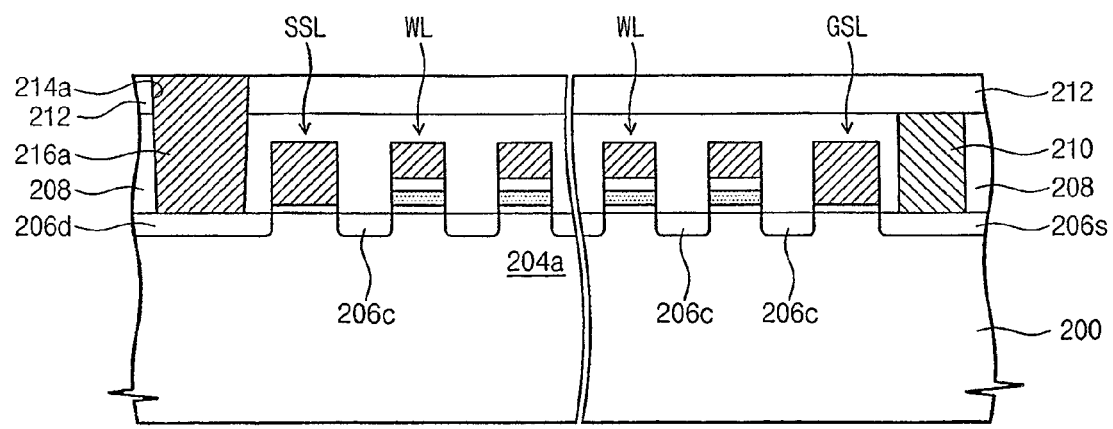

Fig. 7C'
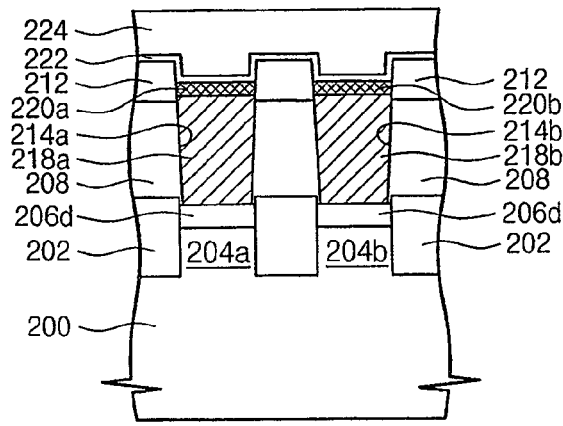
Fig. 7C"
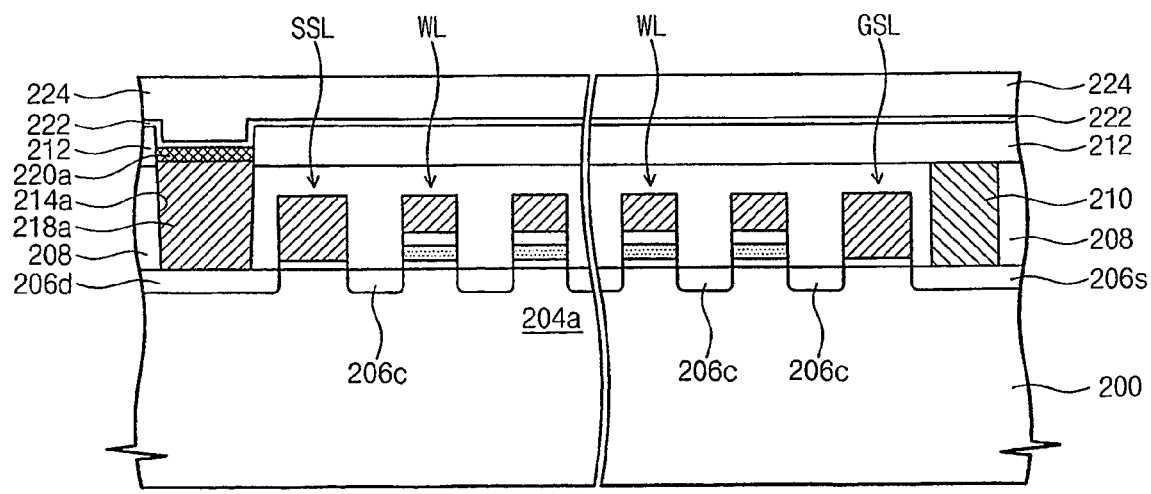

Fig. 7D'
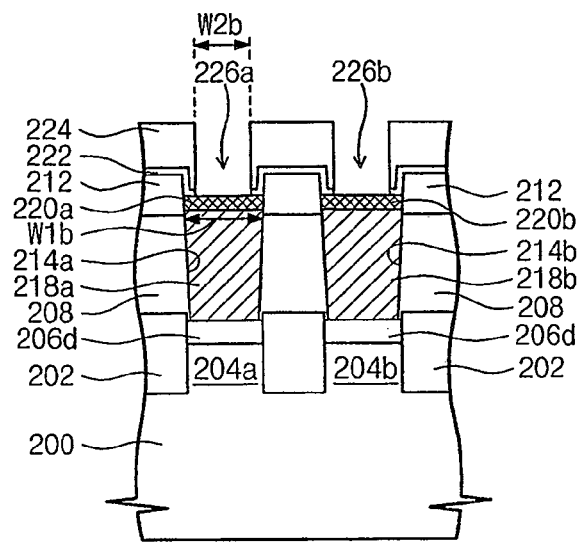
Fig. 7D"
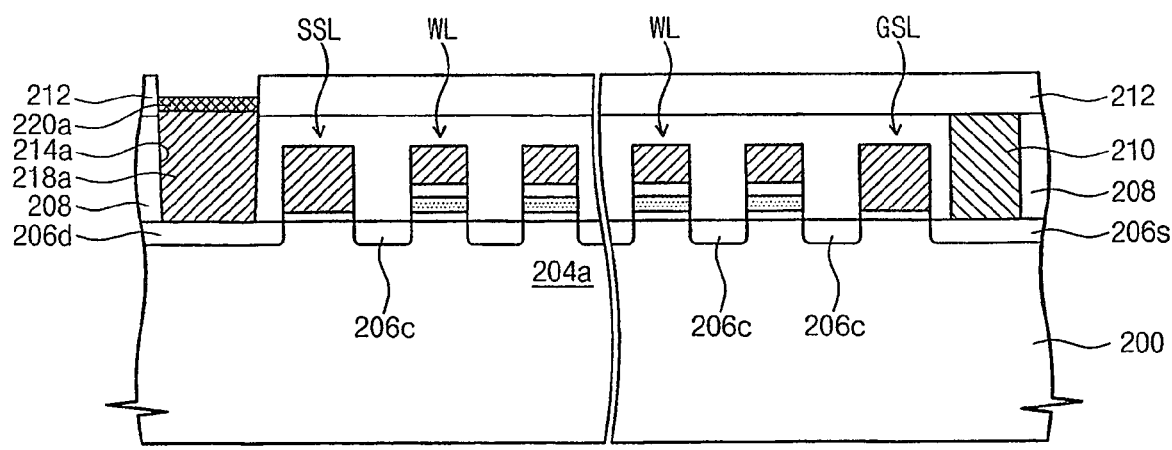

Fig. 7E'
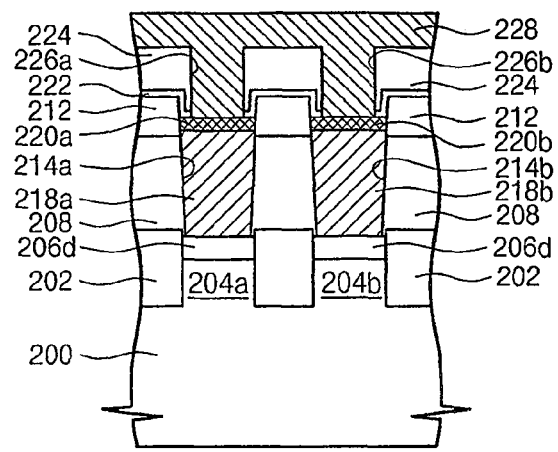
Fig. 7E"
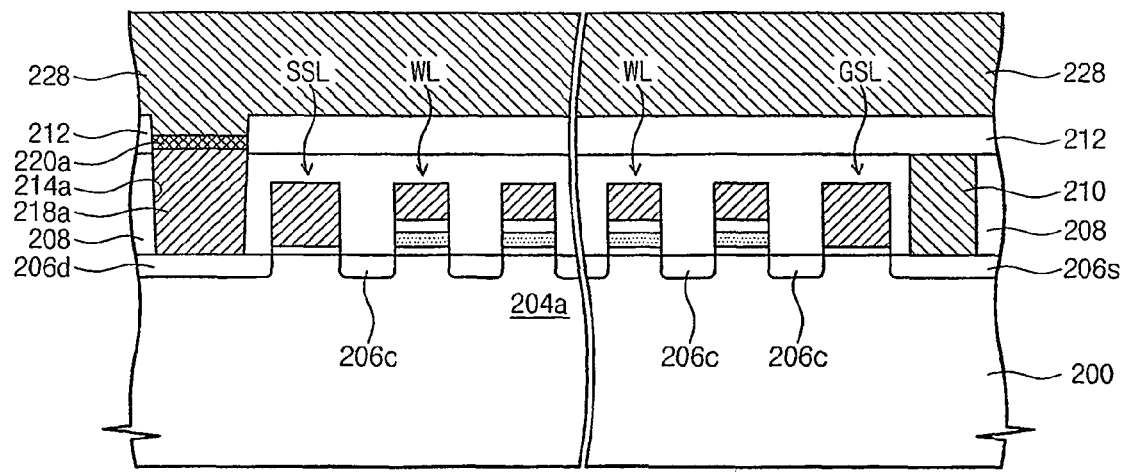

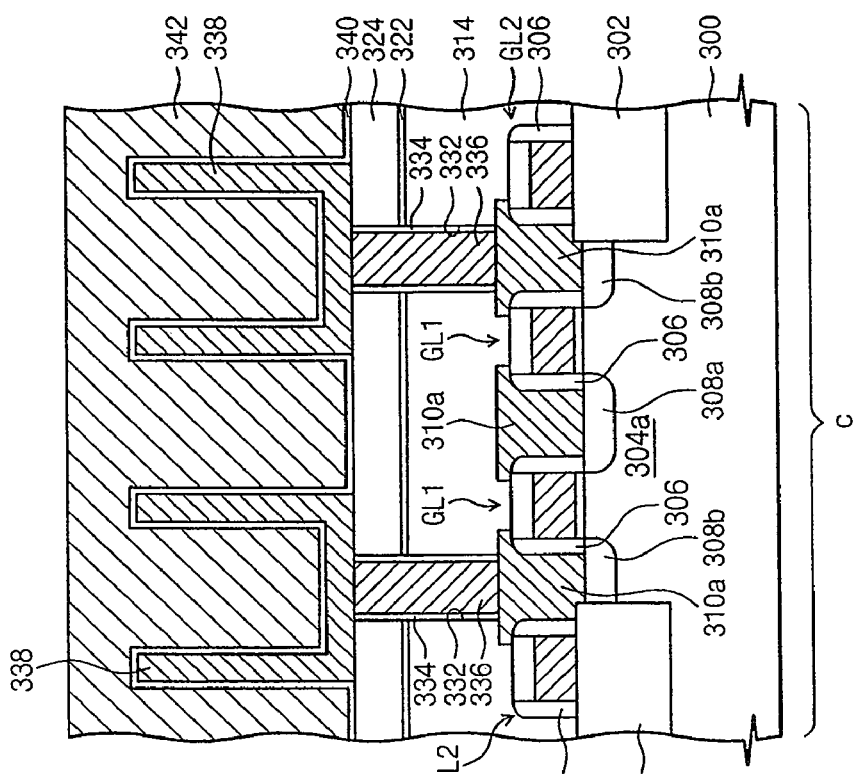
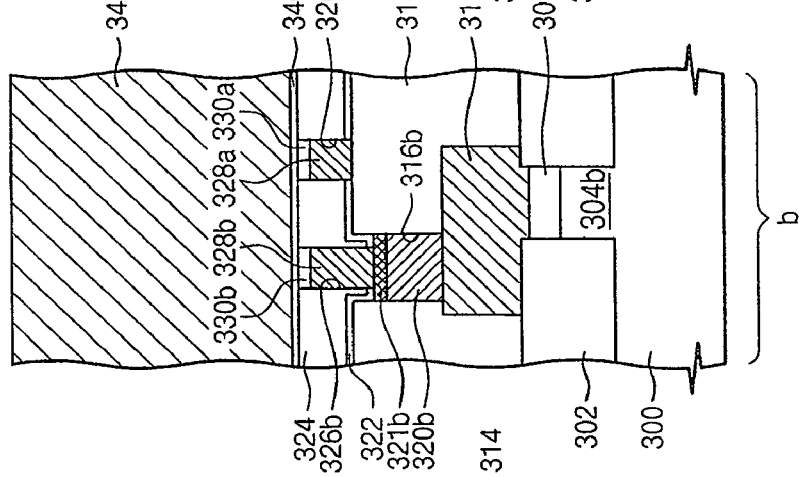
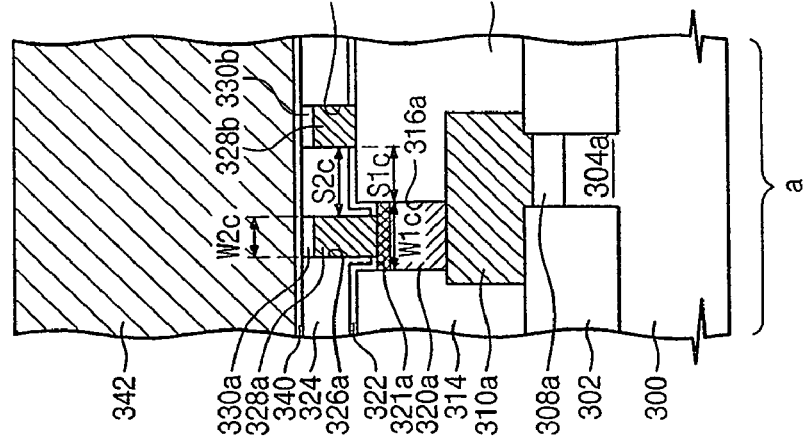

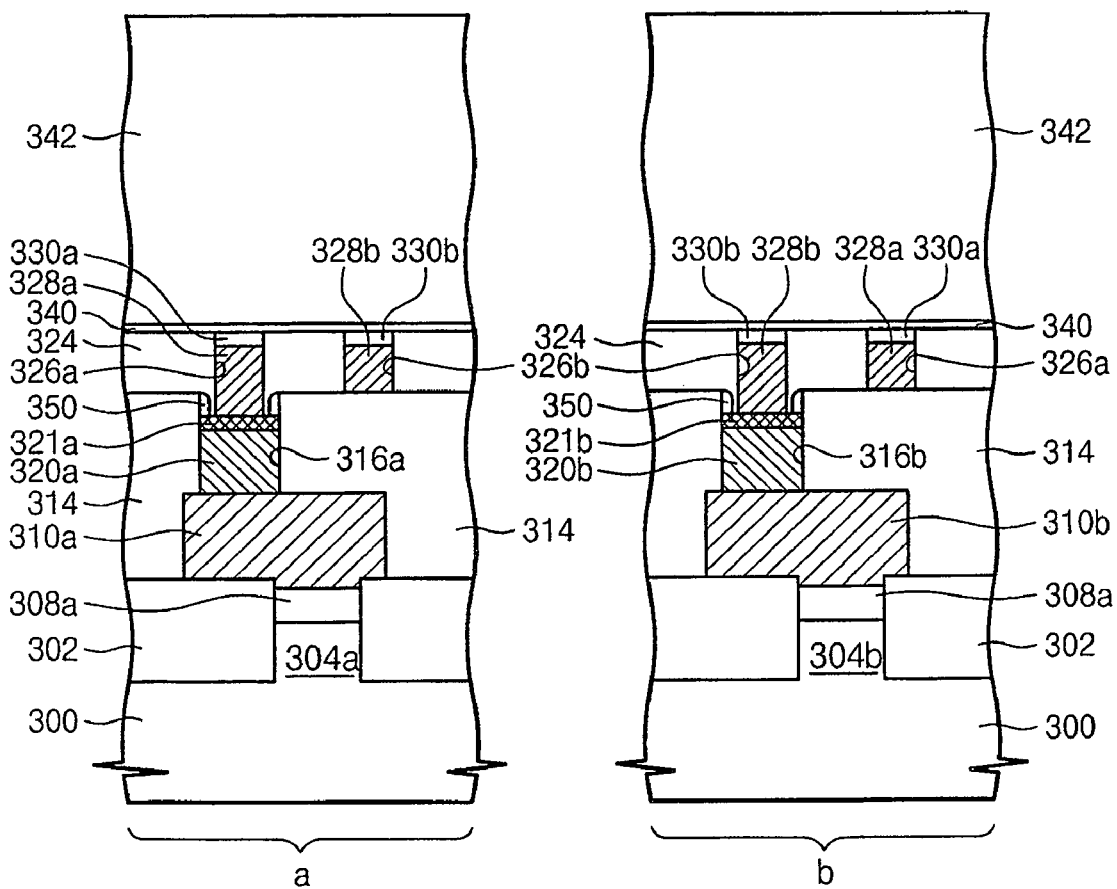

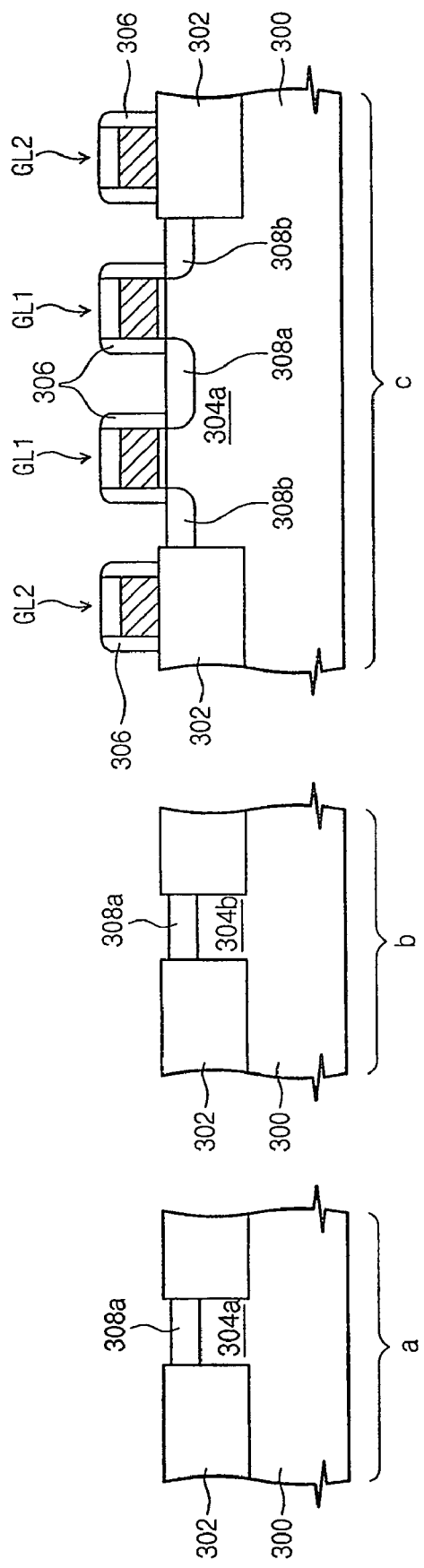

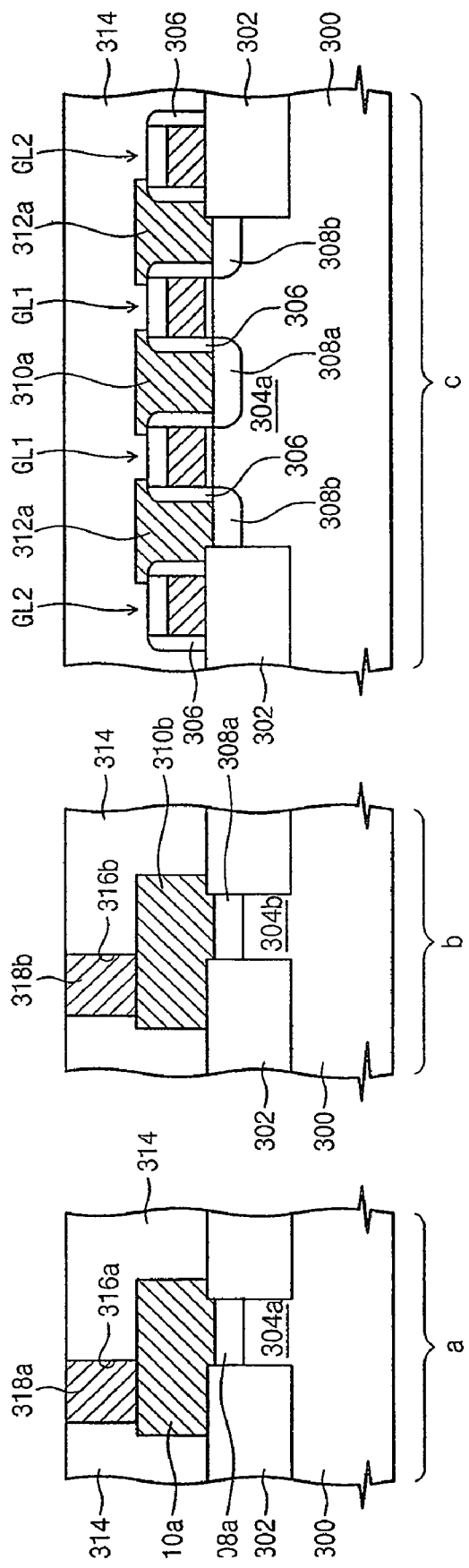

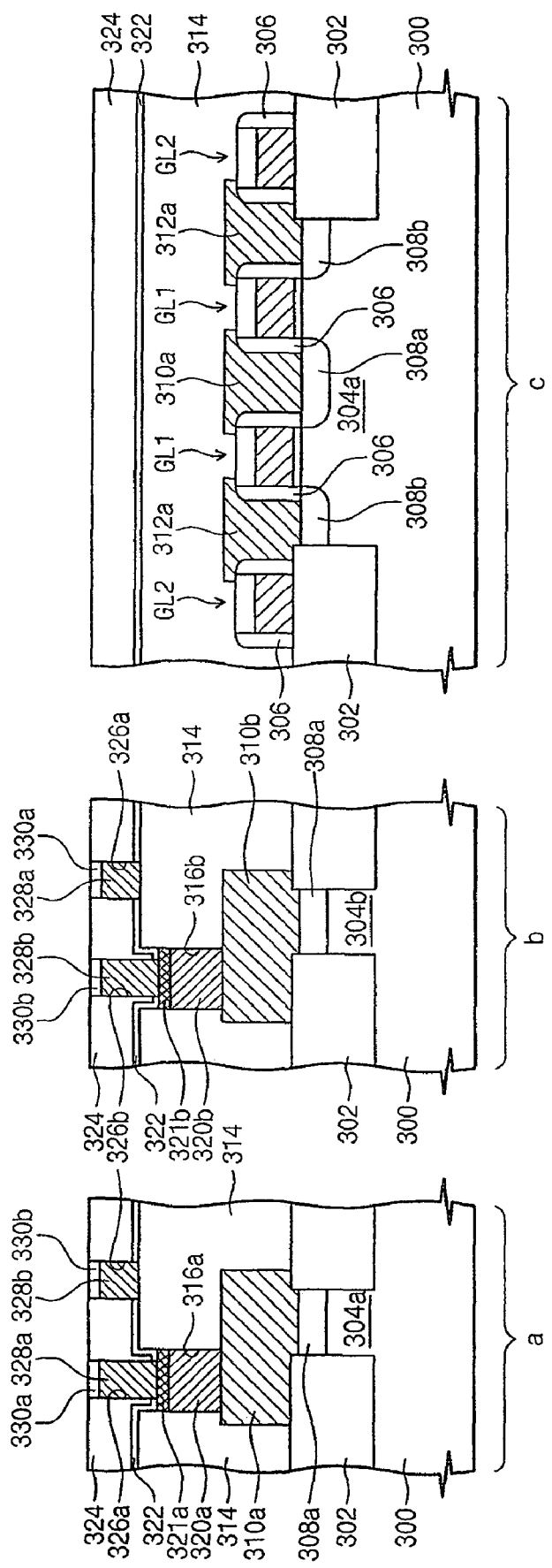

SEMICONDUCTOR DEVICES INCLUDING INTERLAYER CONDUCTIVE CONTACTS AND METHODS OF FORMING THE SAME

RELATED APPLICATIONS

This application claims priority under 35 U.S.C. 119 to Korean Patent Application No. 10-2007-0071781, filed on Jul. 18, 2007, the content of which is incorporated herein by reference in its entirety.

BACKGROUND OF THE INVENTION

With the continued emphasis on highly integrated electronic devices, there is an ongoing need for semiconductor devices that operate at higher speeds and lower power and have increased device density. To achieve these goals, it is necessary for devices to be formed with increased integration and for device components to be formed of lower-resistivity materials. However, as the patterns used to form device components become smaller and as the space between adjacent patterns also becomes smaller, there is a greater likelihood of leakage current propagating between neighboring patterns and components.

To illustrate this problem, in a common configuration for contemporary semiconductor devices, an interlayer contact formed of tungsten is formed in a first interlayer dielectric layer, an etch stop layer, for example silicon nitride, is formed on the first interlayer dielectric layer and a second interlayer dielectric layer is formed on the etch stop layer. A copper bit line pattern is formed in the second interlayer dielectric layer in contact with a top of the underlying interlayer contact. Adhesion between the etch stop layer with the underlying first interlayer dielectric layer is generally weak, and, as a result, when the copper bit line patterns are formed, copper diffusion can occur along the interface of the etch stop layer and the first interlayer dielectric layer. Even in a case where the etch stop layer is not used, copper diffusion can occur at the interface of the underlying first interlayer dielectric layer and the second interlayer dielectric layer.

With increased integration of semiconductor devices, neighboring bit line patterns are formed closer in proximity to each other, and this increases the likelihood of leakage current flowing between adjacent bit line patterns, especially through the region of copper diffusion along the interface of the etch stop layer and the first interlayer dielectric or along the interface of the first and second interlayer dielectric layers. In addition, with increased integration, misalignment of the bit lines relative to the underlying interlayer contact is more likely to occur, due to the relative reduced distance between them, and thus a second form of leakage current can occur between the underlying interlayer contact and a neighboring bit line.

SUMMARY OF THE INVENTION

Embodiments of the present invention are directed to semiconductor devices and methods of forming the same wherein devices can be further integrated without introducing an increased likelihood of leakage current, or reducing the likelihood of leakage current, between neighboring interconnection lines or between an underlying interlayer contact plug and a neighboring interconnection line. This is accomplished by increasing the diffusion path length between neighboring interconnection lines so that any diffusion that occurs along that path is less likely to cause leakage current. This is further accomplished by increasing the distance between an underlying interlayer contact plug and a neighboring interconnection line, thereby reducing the electric field between them, and thus decreasing the leakage current.

In one aspect, a semiconductor device comprises: a first insulating layer on an underlying contact region of the semiconductor device, the first insulating layer having an upper surface; a first conductive pattern in a first opening through the first insulating layer, an upper portion of the first conductive pattern being of a first width, an upper surface of the first conductive pattern being recessed relative to the upper surface of the first insulating layer so that the upper surface of the first conductive pattern has a height relative to the underlying contact region that is less than a height of the upper surface of the first insulating layer relative to the underlying contact region; and a second conductive pattern contacting the upper surface of the first conductive pattern, a lower portion of the second conductive pattern being of a second width that is less than the first width.

The first conductive pattern can include a conductive barrier layer at an upper portion thereof.

The semiconductor device can further comprise a second insulating layer on the first insulating layer, wherein the second conductive pattern is in a second opening through the second insulating layer.

The semiconductor device can further comprise an insulating line spacer at sidewalls of the second opening, wherein a combined width of the insulating line spacer and a width of the second opening at a bottom portion of the second opening is less than or equal to the first width.

The semiconductor device can further comprise an insulating line spacer at sidewalls of the second opening, wherein a combined width of the insulating line spacer and a width of the second opening at a bottom portion of the second opening is greater than the first width.

The semiconductor device can further comprise a third conductive pattern on the first insulating layer that neighbors the second conductive pattern in a horizontal direction, relative to the underlying first conductive pattern, wherein a leakage current path between the first conductive pattern and the third conductive pattern along an upper boundary of the first insulating layer has a length that is greater than a horizontal distance between the first conductive pattern and the third conductive pattern.

The semiconductor device can further comprise a third conductive pattern on the first insulating layer that neighbors the second conductive pattern in a horizontal direction, relative to the underlying first conductive pattern, wherein a diffusion path between a bottom of the second conductive pattern and a bottom of the third conductive pattern along an upper boundary of the first insulating layer has a length that is greater than a horizontal distance between the second conductive pattern and the third conductive pattern.

An etch stop layer can be present between the first insulating layer and the second insulating layer.

In the semiconductor device, the first conductive pattern can comprise one of: an interconnect line that extends in a horizontal direction of the semiconductor device, relative to the underlying contact region; and a conductive plug; and the second conductive pattern can comprise one of: an interconnect line that extends in a horizontal direction of the semiconductor device, relative to the underlying first conductive pattern; and a conductive plug.

The semiconductor device can further comprise sidewall spacers on sidewalls of the first opening on the upper surface of the first conductive pattern.

The underlying contact region can comprise at least one of a substrate, a doped region of a substrate, an epitaxial layer, a gate electrode of a transistor, a silicide region, and a conductive contact.

The semiconductor device can be, for example, one of a non-volatile memory device or a volatile memory device such as a DRAM, an SRAM, a NAND-type flash, a NOR-type flash, a PRAM, an MRAM, an RRAM and the like.

In another aspect, a semiconductor device comprises: a first insulating layer on an underlying contact region of the semiconductor device, the first insulating layer having an upper surface; a first conductive pattern in a first opening through the first insulating layer, an upper portion of the first conductive pattern being of a first width; a second insulating layer on the first insulating layer; a second conductive pattern through the second insulating layer contacting an upper surface of the first conductive pattern, a lower portion of the second conductive pattern being of a second width that is less than the first width; and a third conductive pattern on the first insulating layer through the second insulating layer that neighbors the second conductive pattern in a horizontal direction, relative to the underlying first conductive pattern, wherein a diffusion path between a bottom of the second conductive pattern and a bottom of the third conductive pattern along an upper boundary of the first insulating layer has a length that is greater than a horizontal distance between the second conductive pattern and the third conductive pattern.

An upper surface of the first conductive pattern can be recessed relative to the upper surface of the first insulating layer so that the upper surface of the first conductive pattern has a height relative to the underlying contact region that is less than a height of the upper surface of the first insulating layer relative to the underlying contact region.

The first conductive pattern can include a conductive barrier layer at an upper portion thereof.

The second conductive pattern can be in a second opening through the second insulating layer.

The semiconductor device can further comprise an insulating line spacer at sidewalls of the second opening, wherein a combined width of the insulating line spacer and a width of the second opening at a bottom portion of the second opening is less than or equal to the first width.

The semiconductor device can further comprise an insulating line spacer at sidewalls of the second opening, wherein a combined width of the insulating line spacer and a width of the second opening at a bottom portion of the second opening is greater than the first width.

A leakage current path between the first conductive pattern and the third conductive pattern along an upper boundary of the first insulating layer can have a length that is greater than a horizontal distance between the first conductive pattern and the third conductive pattern.

An etch stop layer can be present between the first insulating layer and the second insulating layer.

In the semiconductor device, the first conductive pattern can comprise one of: an interconnect line that extends in a horizontal direction of the semiconductor device, relative to the underlying contact region; and a conductive plug; and the second conductive pattern can comprise one of: an interconnect line that extends in a horizontal direction of the semiconductor device, relative to the underlying first conductive pattern; and a conductive plug.

The semiconductor device can further comprise sidewall spacers on sidewalls of the first opening on the upper surface of the first conductive pattern.

The underlying contact region can comprise at least one of a substrate, a doped region of a substrate, an epitaxial layer; a gate electrode of a transistor, a silicide region, and a conductive contact.

In another aspect, a method of forming a semiconductor device comprises: providing a first insulating layer on an underlying contact region of the semiconductor device, the first insulating layer having an upper surface; forming a first opening in the first insulating layer to expose the underlying contact region; providing a first conductive pattern in the first opening, an upper portion of the first conductive pattern being of a first width, an upper surface of the first conductive pattern being recessed relative to the upper surface of the first insulating layer so that the upper surface of the first conductive pattern has a height relative to the underlying contact region that is less than a height of the upper surface of the first insulating layer relative to the underlying contact region; and providing a second conductive pattern contacting the upper surface of the first conductive pattern, a lower potion of the second conductive pattern being of a second width that is less than the first width.

The method can further comprise providing a conductive barrier layer at an upper portion of the first conductive pattern.

Providing the second conductive pattern can comprise: providing a second insulating layer on the first insulating layer; forming a second opening in the second insulating layer to expose the upper surface of the first conductive pattern; and providing the second conductive pattern in the second opening in contact with the upper surface of the first conductive pattern.

The method can further comprise forming an insulating line spacer at sidewalls of the second opening wherein a combined width of the insulating line spacer and the second width of the second opening at a bottom portion of the second opening is less than or equal to the first width.

The method can further comprise forming an insulating line spacer at sidewalls of the second opening wherein a combined width of the insulating line spacer and the second width of the second opening at a bottom portion of the second opening is greater than the first width.

The method can further comprise: providing a third conductive pattern on the first insulating layer that neighbors the second conductive pattern in a horizontal direction, relative to the underlying first conductive pattern, wherein a leakage current path between the first conductive pattern and the third conductive pattern along an upper boundary of the first insulating layer has a length that is greater than a horizontal distance between the first conductive pattern and the third conductive pattern.

The method can further comprise: providing a third conductive pattern on the first insulating layer that neighbors the second conductive pattern in a horizontal direction, relative to the underlying first conductive pattern, wherein a diffusion path between a bottom of the second conductive pattern and a bottom of the third conductive pattern along an upper boundary of the first insulating layer has a length that is greater than a horizontal distance between the second conductive pattern and the third conductive pattern.

The method can further comprise providing an etch stop layer on the first insulating layer and on the first conductive pattern prior to providing the second insulating layer, wherein forming the first opening in the first insulating layer and providing a first conductive pattern in the first opening are performed prior to providing the etch stop layer.

The method can further comprise providing an etch stop layer on the first insulating layer prior to providing the second insulating layer, wherein forming the first opening in the first insulating layer and providing a first conductive pattern in the first opening are performed subsequent to providing the etch stop layer.

Providing the first conductive pattern can further comprise one of: forming an upper portion of the first conductive pattern to extend in a horizontal direction of the semiconductor device relative to the underlying contact region to form a first interconnect line pattern; and providing a conductive plug; and providing the second conductive pattern can further comprise one of: providing an interconnect line that extends in a horizontal direction of the semiconductor device, relative to the underlying first conductive pattern; and providing a conductive plug The method can further comprise providing sidewall spacers on sidewalls of the first opening on the upper surface of the first conductive pattern.

The underlying contact region can comprise at least one of a substrate, a doped region of a substrate, an epitaxial layer; a gate electrode of a transistor, a silicide region, and a conductive contact.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 7A'-7E' are cross-sectional views illustrating formation of the device of FIGS. 6A-6D, taken along section line II-II', and FIGS. 7A"-7E" are cross-sectional views illustrating formation of the device of FIGS. 6A-6D, taken along section line III-III', in accordance with an embodiment of the present invention.

FIG. 8B is a cross-sectional view of the device of FIG. 8A, taken along section line IV-IV'. FIG. 8C is a cross-sectional view of the device of FIG. 8A, taken along section line V-V'. FIG. 8D is a cross-sectional view of the device of FIG. 8A, taken along section line VI-VI'. FIGS. 8E and 8F are cross-sectional views of the device of FIG. 8A, taken along section line IV-IV' and V-V' respectively, in accordance with another embodiment of the present invention.

FIGS. 9A'-9C' are cross-sectional views illustrating formation of the device of FIGS. 8A-8F, taken along section line IV-IV', FIGS. 9A"-9C" are cross-sectional views illustrating formation of the device of FIGS. 8A-8F, taken along section line V-V', and FIGS. 9A'''-9C''' are cross-sectional views illustrating formation of the device of FIGS. 8A-8F, taken along section line VI-VI' in accordance with an embodiment of the present invention.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1A:
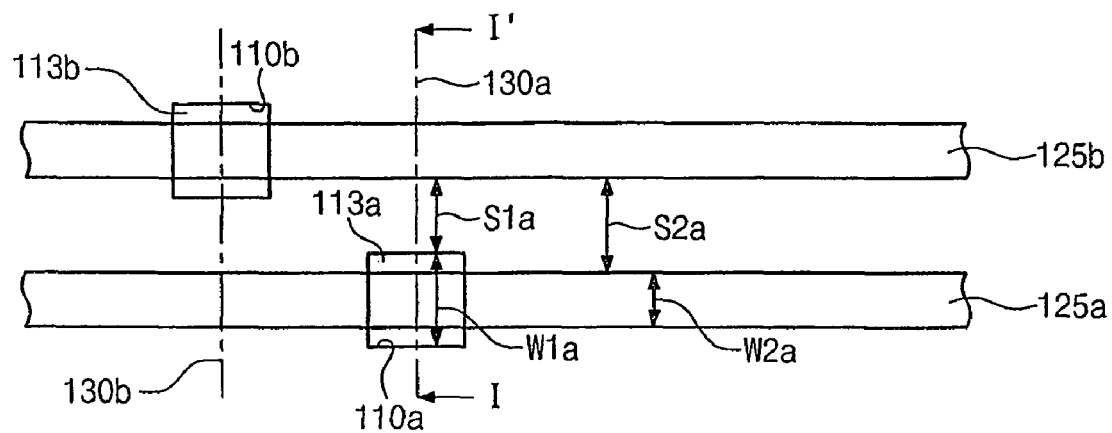
FIG. 1A is a planar top view of a semiconductor device including neighboring interconnection lines coupled to underlying interlayer contact plugs, in accordance with an embodiment of the present invention.
Figure 1B:
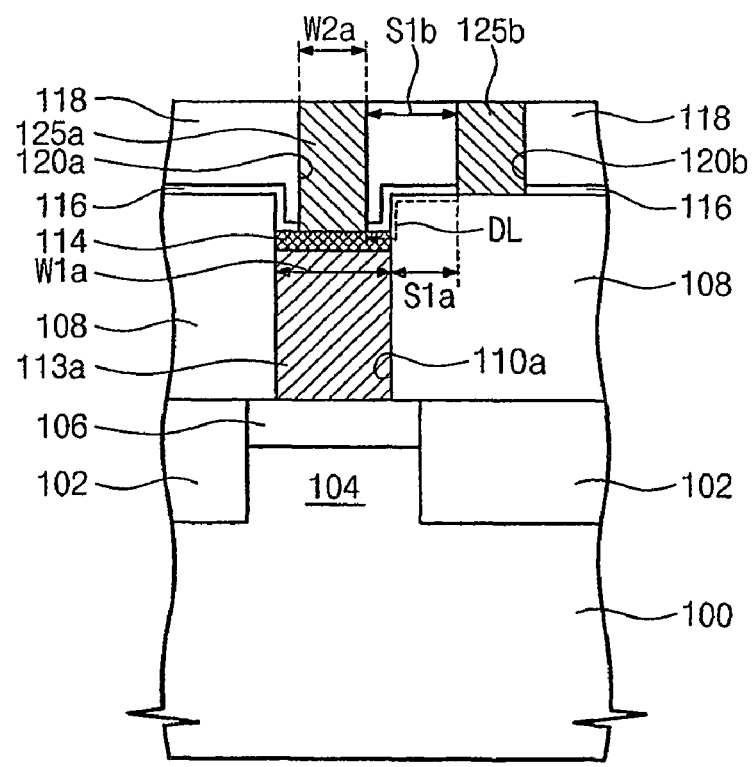
FIG. 1B is a cross-sectional view of the embodiment of FIG. 1A, taken along section line I-I', in accordance with an embodiment of the present invention.
Figure 2A:
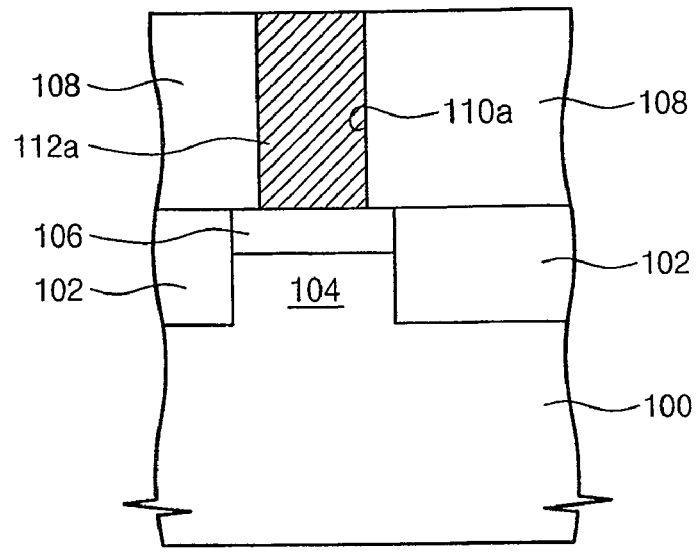
FIGS. 2A-2C are cross-sectional views of a method of forming a semiconductor device, in accordance with an embodiment of the present invention.
Figure 2B:
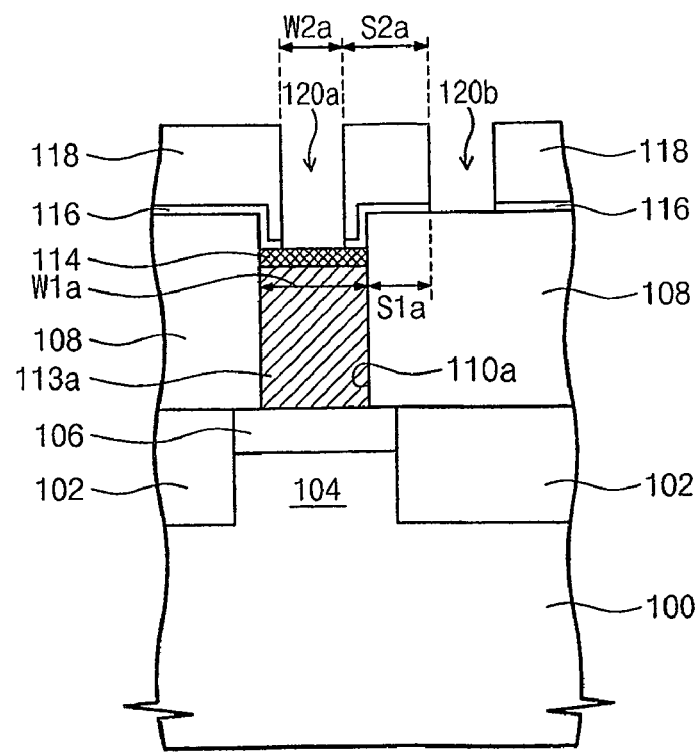
Figure 2C:
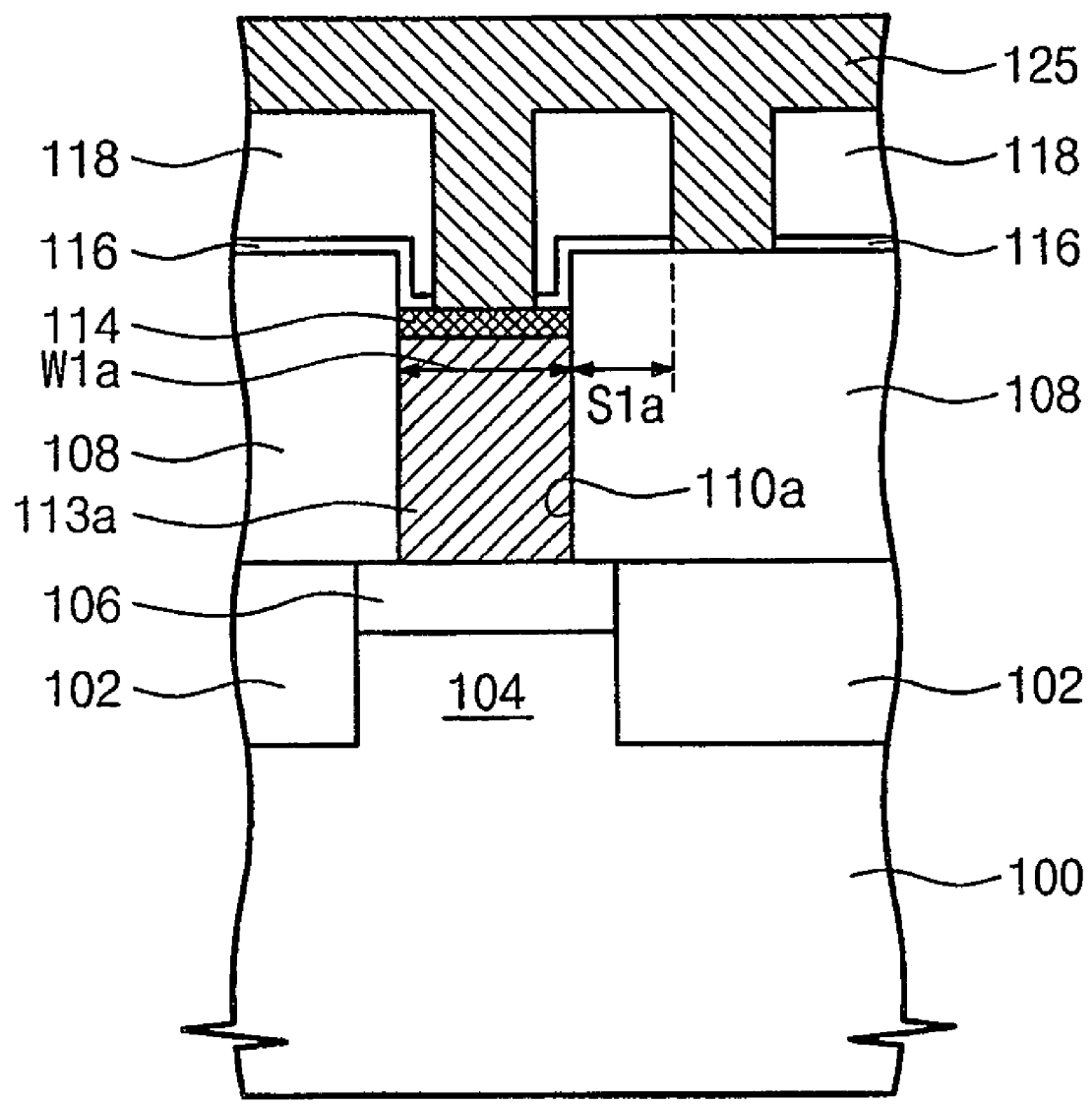

FIG. 1A is a planar top view of a semiconductor device including neighboring interconnection lines coupled to underlying interlayer contact plugs, in accordance with an embodiment of the present invention. FIG. 1B is a cross-sectional view of the embodiment of FIG. 1A, taken along section line I-I', in accordance with an embodiment of the present invention. FIGS. 2A-2C are cross-sectional views of a method of forming a semiconductor device, in accordance with an embodiment of the present invention.

With reference to FIGS. 1A, 1B, and 2A, isolation regions 102 are provided in a semiconductor substrate 100. An active region 104 of the device, or other region to be contacted, is defined between the isolation regions 102. In this example, a top portion of the active region 104 is doped with impurities 106; however, other types of such contact regions to be contacted by an interlayer conductive pattern are equally applicable to the principles of the embodiments of the present invention. For example, the region 104, 106 can take the form of a terminal of a transistor, such as a gate, drain or source of a transistor, which has a silicide region on its upper surface.

Referring to FIG. 2A, a first interlayer insulating layer 108 is formed on the underlying structure. In one example embodiment, the first interlayer insulating layer 108 comprises silicon oxide. The first interlayer insulating layer 108 is patterned according to conventional fabrication methods to form a first opening 110a in the first interlayer insulating layer 108 that exposes the underlying active region 104. In this example, the first opening has a width W1a at or near a top portion thereof, as shown in FIG. 2B, below. It should be noted that any such openings and the resulting structures to be formed therein will not have perfectly vertical sidewalls, but instead will have tapered sidewalls as a natural result of the etching methods used to form the openings. An optional barrier layer may be formed in the contact opening to prevent diffusion of metal ions from a conductive pattern to be formed in the first opening 110a into the first interlayer insulating layer 108.

A conductive layer is applied to the resulting structure, thereby filling the first opening 110a and making contact with the underlying active region 104. In one embodiment, the conductive layer comprises a tungsten layer deposited using physical vapor deposition (PVD), chemical vapor deposition (CVD) or electroless plating, according to conventional fabrication methods. The conductive layer is then planarized, resulting in formation of a first conductive pattern 112a in the first opening 110a. The conductive layer can be formed of a conductive material suitable for highly integrated fabrication methods, including metal having a low resistivity, such as Al or Cu, and can include a wetting or barrier layer such as Ti, Ta, Mo, TixNy, TaxNy, TixZry, TixZryNz, NbxNy, ZrxNy, WxNy, VxNy, HfxNy, MoxNy, RexNy, and TixSiyNz.

Referring to FIG. 2B, a top portion of the first conductive pattern 112a is made to be recessed in the first opening 110a. The resulting recess can be formed, for example, by chemical-mechanical polishing (CMP), by an etch-back process, or by a dry etch process, according to conventional fabrication methods. In a case where CMP is used, the slurry can be selected to remove a top portion of the conductive pattern 112a, for example, the tungsten layer, while not removing, or minimally removing, the top portion of the first interlayer insulating layer 108. The resulting recessed conductive pattern 113a has an upper surface that lies below an upper surface of the first interlayer insulating layer 108, and is therefore recessed in the first opening 100a. Also, the recessed conductive pattern 113a has a width that is equal to, or marginally less than, the width of the first opening W1a.

An optional barrier layer pattern 114 can be provided on an upper surface of the resulting recessed conductive pattern 113a. The barrier pattern 114 serves as a diffusion barrier to prevent reaction between the conductive materials of the recessed conductive pattern 113a and a conductive material 125 to be deposited thereon (see FIG. 2C). The barrier layer pattern 114 can comprise, for example, CoWP, CoP and CoB applied using CVD, atomic layer deposition (ALD) or electroless plating deposition methods. In a case where the optional barrier layer pattern is employed, an upper surface of the resulting barrier layer pattern 114 lies below an upper surface of the first interlayer insulating layer 108, so that the combined recessed conductive pattern 113a and barrier layer pattern 114 is recessed in the first opening 110a.

An optional etch stop layer 116 can be applied to an upper surface of the resulting structure. The etch stop layer 116 can be conformal so that it coats sidewalls of the exposed upper portion of the first opening 110a. In various embodiments, the etch stop layer can comprise a single layer or multiple layers of SiN, SiC and/or SiCN. The etch stop layer 116 material should be chosen to have etch selectivity with respect to a material of a second interlayer insulating layer 118 to be subsequently applied to the resulting structure. In a case where the material of the first interlayer insulating layer 108 has etch selectivity with respect to the material of the second interlayer insulating layer 118, the etch stop layer is not necessary.

Continuing to refer to FIG. 2B, a second interlayer insulating layer 118 is next applied to the resulting structure. The first interlayer insulating layer 108 can comprise, for example, silicon oxide or SiCOH, and preferably comprises a low-k material to reduce interference between adjacent neighboring patterns. The second interlayer insulating layer 118 is patterned according to conventional fabrication methods to form second openings 120a, 120b in the second interlayer insulating layer 118. In this case, a first of the second openings 120a exposes a top surface of the underlying recessed conductive pattern 113a or the optional barrier layer 114 on the top of the recessed conductive pattern 113a. In this example, the first of the second openings has a width W2a, that is less than the width of the underlying first opening W1a. A neighboring, second, of the second openings 120b exposes a top surface of the first interlayer insulating layer. An optional barrier layer (not shown) may be formed in the second contact openings to prevent diffusion of metal ions, for example copper ions, from second conductive patterns to be formed in the second openings 120a, 120b into the second interlayer insulating layer 118. The optional barrier layer may comprise, for example, TaN, Ta, WN, TiN in a single layer or multiple layers.

Referring to FIG. 2C, an optional metal seed layer, for example a copper seed layer, is conformally applied to the resulting structure including the second openings 120a, 120b, for example using PVD. Next, a conductive material 125 having low electrical resistance is applied to fill the second openings 120a, 120b. The conductive material 125 may comprise, for example, electroplated copper or super-critical-fluid copper that is applied using conventional fabrication techniques. Next, a CMP process is applied to separate the applied conductive fill material into separate conductive patterns 125a, 125b (see FIG. 1B), that can for example, form separate bit lines of the device.

Referring to FIG. 1B, the resulting device has a recessed, first conductive pattern 113a or recessed first conductive pattern/barrier layer 113a/114 that has a width of W1a. For purposes of the present specification, both embodiments of the recessed first conductive pattern 113a or recessed first conductive pattern/barrier layer 113a/114 will be referred to collectively herein as the "recessed first conductive pattern 113a". The upper surface of the recessed first conductive pattern 113a is at a level below the upper surface of the first interlayer insulating layer 108.

The bottom of the first of the second conductive patterns 125a makes conductive pattern with the upper surface of the recessed first conductive pattern 113a at a position that lies below the upper surface of the first interlayer insulating layer 108. Also, a lower, or bottom, portion of the first of the second conductive patterns 125a has a width W2a, that is less than the width W1a of the upper portion of the underlying recessed first conductive pattern 113a. The neighboring second of the second conductive patterns 125b is spaced apart from the first of the second conductive patterns 125a by a second distance S1b in a horizontal direction, and the neighboring second of the second conductive patterns 125b is spaced apart from the recessed first conductive pattern 113a by a first distance S1a in a horizontal direction. Since the width W1a of the underlying recessed first conductive pattern 113a is greater than the width W2a of the first of the second conductive patterns 125a, it follows that the first distance S1a is less than the second distance S1b.

In view of the above, the contact configuration of the present embodiment has a diffusion path length DL between the neighboring first and second of the second conductive patterns 125a, 125b that is greater than the second distance S1b by which they are spaced apart in a horizontal direction. This is because the diffusion path length includes not only the horizontal distance between the first and second of the second conductive patterns 125a, 125b, but also the vertical distance by which the first of the second conductive patterns 125a is recessed to make contact with the upper surface of the recessed first conductive pattern 113a. The recess distance effectively increases the diffusion path length between the first and second of the second conductive patterns 125a, 125b. The increased diffusion path length DL reduces the effect of leakage current between the first and second of the second conductive patterns 125a, 125b, thereby alleviating the design constraints associated therewith, and allowing for further integration of the resulting device.

At the same time, the contact configuration of the present embodiment has a leakage current path length between the underlying recessed first conductive pattern 113a and the neighboring second of the second conductive patterns 125b that is greater than the distance between the recessed first conductive pattern 113a and the neighboring second of the second conductive patterns 125b in a horizontal direction, or distance SS1a. This is because the leakage current path length includes not only the horizontal distance between the recessed first conductive pattern and the neighboring second conductive pattern 125b, but also the vertical distance by which the first conductive patterns 113a is recessed in the first opening 110a. This effectively increases the leakage current path length between the first conductive pattern 113a and the neighboring second of the second conductive patterns 125b, again alleviating the design constraints associated therewith, and allowing for further integration of the resulting device.

In the embodiments described herein, the term "first conductive pattern" as used herein includes both plug-type contacts and line-type contacts. Also, the term "second conductive pattern" as used herein includes both plug-type contacts and line-type contacts. For example, in a case wherein the first or second conductive patterns comprise line-type contacts, they can comprise bit lines of a semiconductor memory device that extend in a horizontal direction of the device.

In another embodiment, the optional etch stop layer 116 shown in FIG. 2B can be provided on the surface of the underlying first interlayer insulating layer 108 prior to formation of the first opening 110a in the first interlayer insulating layer 108. Referring to FIG. 2A, the first opening 110a is then formed through the etch stop layer 116 and through the first interlayer insulating layer 108 to expose the underlying active region 104. The conductive layer is then provided in the first opening 110a, and planarized, as described above, to form the first conductive pattern 112a through the etch stop layer 116 and through the first interlayer insulating layer 108. Following this, the resulting conductive pattern 113a is made to be recessed in the first opening 110a, in the manner described above in connection with FIG. 2B. Next, the optional barrier layer pattern 114 can be provided on the upper surface of the resulting recessed conductive pattern 113a, as described above. The process is then completed by applying the second interlayer insulating layer 118 and the second conductive material layer 125, followed by patterning of the layer 125, as shown and described above in connection with FIGS. 2B and 2C. In this embodiment, the optional etch stop layer 116 is not present on side portions of the upper surface of the recessed conductive pattern 113a and on the sidewalls of the upper portions of the first opening 110a, above the recessed conductive pattern 113a, as shown in FIG. 1B. Instead, the material of the second interlayer insulating layer 118 fills the portion of the first opening 110a that lies above the recessed conductive pattern 113a.

Figure 3:
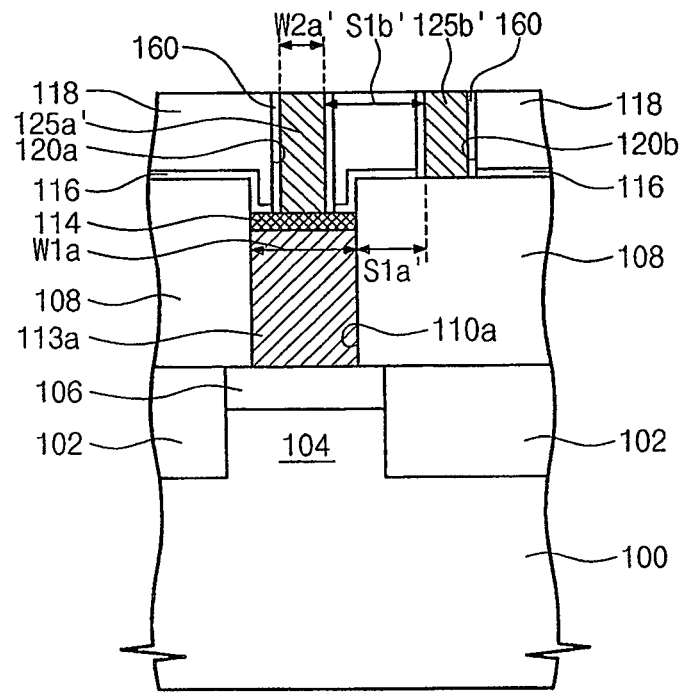
FIG. 3 is a cross-sectional view of the embodiment of FIG. 1A, taken along section line I-I', in accordance with another embodiment of the present invention.

FIG. 3 is a cross-sectional view of the embodiment of FIG. 1A, taken along section line I-I', in accordance with another embodiment of the present invention. This embodiment is substantially similar to the embodiment described above in connection with FIGS. 1B and 2A-2C, with the exception being the presence of line spacers 160 at sidewalls of the second openings 120a, 120b. In this embodiment, following formation of the second openings 120a, line spacers 160 are provided in the second openings 120a, 120b at sidewalls of the second openings. In one embodiment, the line spacers 160 can be formed by a conformal deposition of insulating material, such as $SiO_2$ or SiN, followed by an etch to expose the upper surface of the recessed first conductive pattern 113a. With the line spacers 160 present in the second openings 120a, 120b, the resulting second conductive patterns 125a', 125b' are further reduced in width W2a' relative to the embodiment described above in connection with FIGS. 1B and 2A-2C. This operates to lengthen the critical distances, namely the first horizontal distance S1a' and the second horizontal distance S1b', which in turn effectively increases the diffusion path length DL (see FIG. 1B) between the neighboring first and second of the second conductive patterns 125a', 125b' and effectively increases the leakage current path length between the underlying recessed first conductive pattern 113a and the neighboring second of the second conductive patterns 125b', further enhancing the advantages of the embodiments of the present invention described above.

Figure 4:
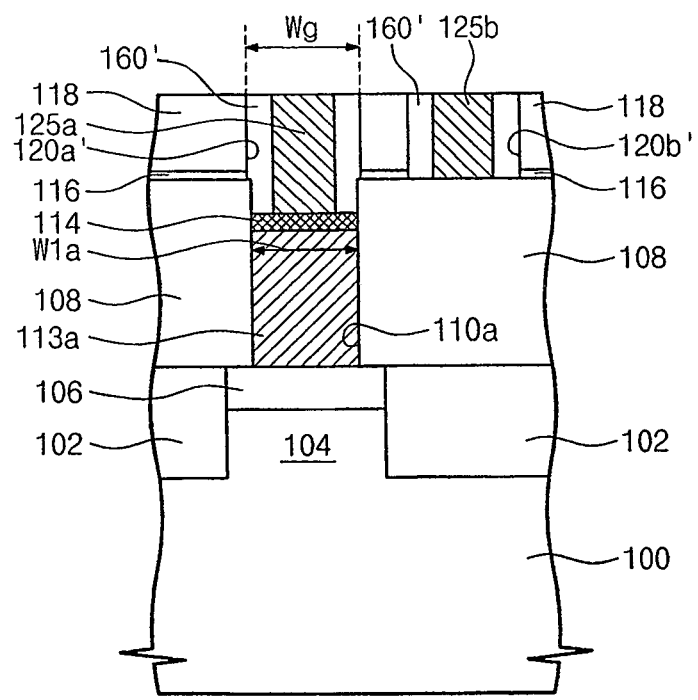
FIG. 4 is a cross-sectional view of the embodiment of FIG. 1A, taken along section line I-I', in accordance with another embodiment of the present invention.

FIG. 4 is a cross-sectional view of the embodiment of FIG. 1A, taken along section line I-I', in accordance with another embodiment of the present invention. This embodiment is substantially similar to the embodiment described above in connection with FIG. 3, with the exception being that the present embodiment illustrates that the original width Wg of the second opening, prior to formation of the line spacers 160' at sidewalls of the second openings 120a', 120b' can be equal to or greater than the width W1a of the underlying first conductive pattern 113a. In this embodiment, following formation of the second openings 120a', line spacers 160' that are relatively wider than the line spacers 160 of the embodiment of FIG. 3 are provided in the second openings 120a', 120b' at sidewalls of the second openings. As described above, the line spacers 160' can be formed by a conformal deposition of insulating material, such as $SiO_2$ or SiN, followed by an etch to expose the upper surface of the recessed first conductive pattern 113a. With the line spacers 160' present in the second openings 120a', 120b', the resulting second conductive patterns 125a, 125b are reduced in width in the manner described above in connection with FIG. 3, offering the advantages described above.

Figure 5:
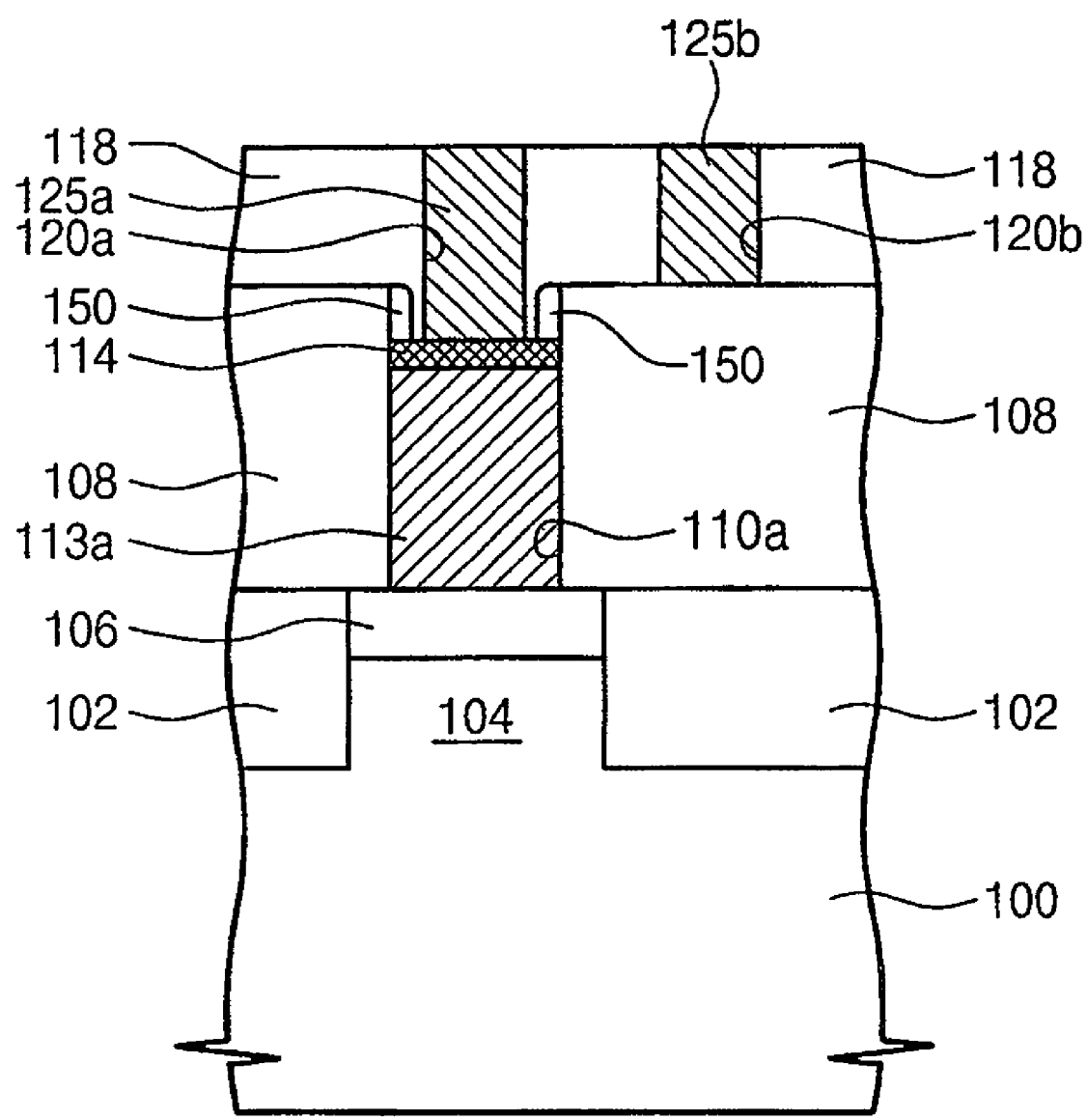
FIG. 5 is a cross-sectional view of the embodiment of FIG. 1A, taken along section line I-I', in accordance with another embodiment of the present invention.

FIG. 5 is a cross-sectional view of the embodiment of FIG. 1A, taken along section line I-I', in accordance with another embodiment of the present invention. This embodiment is substantially similar to the embodiment described above in connection with FIGS. 1B and 2A-2C, with the exception being the presence of sidewall spacers 150 at sidewalls of the first opening 110a. In this embodiment, following formation of the recessed first conductive pattern 113a, sidewall spacers 150 are provided in the first opening 110a at sidewalls of the top portion of the first opening on the upper surface of the underlying first conductive pattern 113a. In one embodiment, the sidewall spacers 150 can be formed by a deposition of insulating material, such as $SiO_2$ or SiN, followed by an anisotropic etch to control with width of the resulting spacers 150 and to expose the upper surface of the recessed first conductive pattern 113a. With the sidewall spacers 150 present in the first opening 110a, the fabrication process can accommodate misalignment between the first of the second conductive patterns 125a and the first conductive pattern 113a. For example, if the opening 120 used for the first of the second conductive patterns 125a is formed too closely to the left or right edge of the first conductive pattern 113, the sidewall spacers 150 guarantee that the actual point of contact between the first of the second conductive patterns 125a and the first conductive pattern 113a is at a point on the upper surface of the first conductive pattern 113 that is spaced apart from the outer edge of the first conductive pattern 113, so that the advantages described herein can be realized.

Figure 6A:
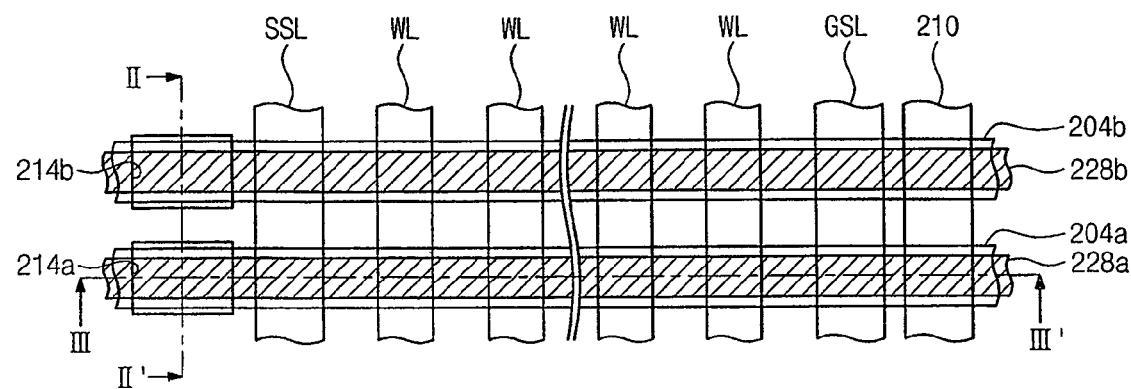
FIG. 6A is a planar top view of a non-volatile memory semiconductor device including neighboring interconnection lines in the form of bit line patterns coupled to underlying interlayer contact plugs, in accordance with an embodiment of the present invention.
Figure 6B:
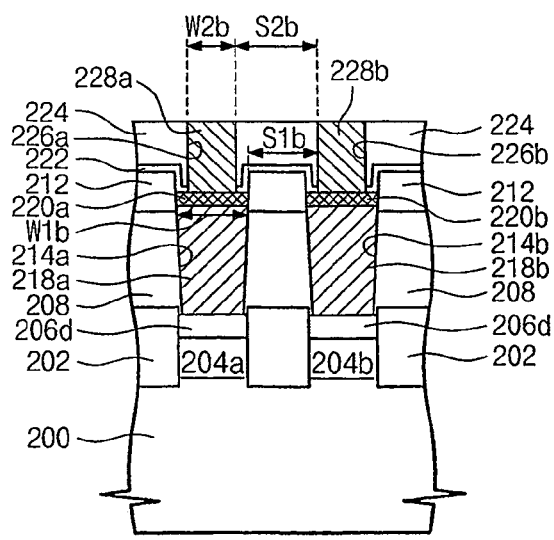
FIG. 6B is a cross-sectional view of the device of FIG. 6A, taken along section line II-II'.
Figure 6C:
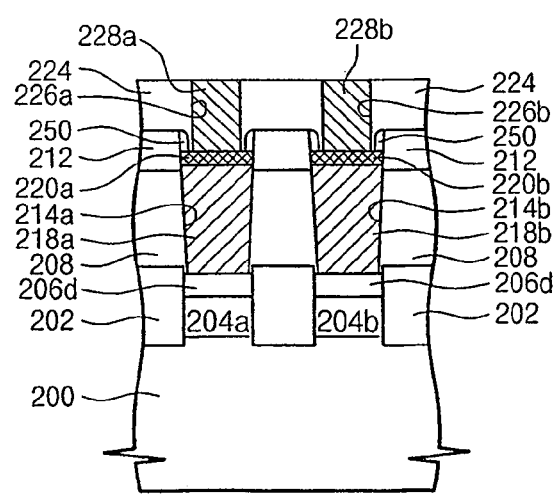
FIG. 6C is a cross-sectional view of the device of FIG. 6A, taken along section line II-II', in accordance with another embodiment of the present invention.
Figure 6D:
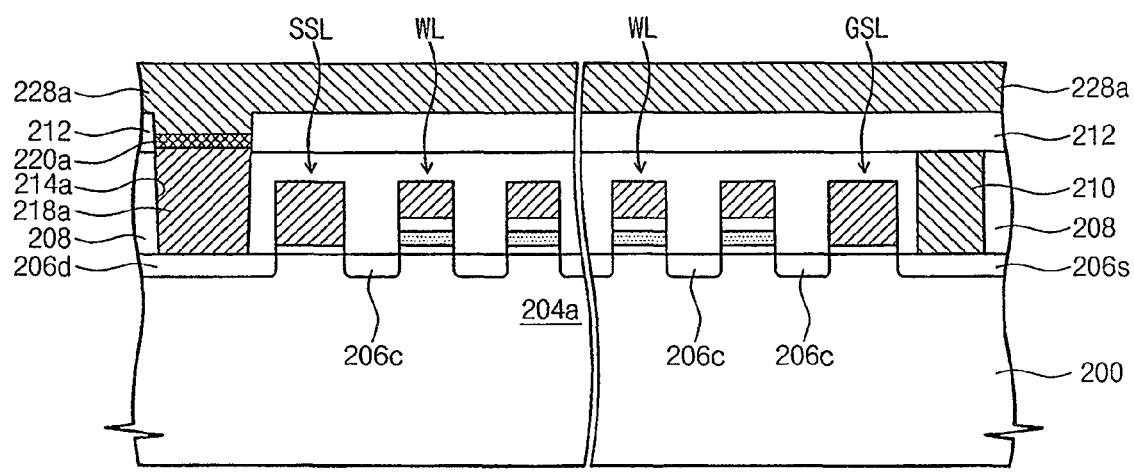
FIG. 6D is a cross-sectional view of the device of FIG. 6A, taken along section line III-III'.

FIG. 6A is a planar top view of a non-volatile memory semiconductor device including neighboring interconnection lines in the form of bit line patterns coupled to underlying interlayer contact plugs, in accordance with an embodiment of the present invention. FIG. 6B is a cross-sectional view of the device of FIG. 6A, taken along section line II-II'. FIG. 6C is a cross-sectional view of the device of FIG. 6A, taken along section line II-II', in accordance with another embodiment of the present invention. FIG. 6D is a cross-sectional view of the device of FIG. 6A, taken along section line III-III'.

FIGS. 7A'-7E' are cross-sectional views illustrating formation of the device of FIGS. 6A-6D, taken along section line II-II', and FIGS. 7A"-7E" are cross-sectional views illustrating formation of the device of FIGS. 6A-6D, taken along section line III-III', in accordance with an embodiment of the present invention.

In the embodiment of FIGS. 6A-6D, a non-volatile memory semiconductor device includes first and second active regions 204a, 204b formed in a semiconductor substrate 200. The first and second active regions 204a, 204b are defined by isolation regions 202 (see FIGS. 7A' and 7A"). First and second first conductive patterns 218a, 218b, are formed to extend through first openings 214a, 214b in the first and second interlayer insulating layers 208, 212 and make contact with doped regions 206d of the first and second active regions 204a, 204b (see FIGS. 7B' and 7B"). Upper surfaces of the first and second first conductive patterns 218a, 218b are of a width W1b and are recessed relative to an upper surface of the second interlayer insulating layer 212 (see FIGS. 7C' and 7C"). In this example, optional barrier layers 220a, 220b are included on the upper surfaces of the first and second first conductive patterns 218a, 218b. First and second second conductive patterns 228a, 228b are formed through openings 226a, 226b formed through a third interlayer insulating layer 224, in contact with the respective first and second first conductive patterns 218a, 218b, in the manner described above (see FIGS. 7D' and 7D"). An optional etch stop layer 222 is provided on the upper surface of the second interlayer insulating layer 212 (see FIGS. 7E' and 7E").

Word lines WL, ground select lines GSL, common source lines CSL 210, and string select lines SSL extend in a first horizontal direction of the device. The word lines WL include a tunnel layer, a charge storing layer and a blocking insulating layer between the substrate and the gate electrode, as is customary in contemporary non-volatile memory device configurations. The first and second second conductive patterns 228a, 228b in this example comprise bit lines that extend in a second horizontal direction of the device. While a NAND-type non-volatile memory device structure is shown in the above drawings, the same principles are equally applicable to NOR-type non-volatile memory device and other non-volatile memory device configurations.

As in the above examples, the width W2b of the first and second second conductive patterns 228a, 228b is less than the width W1b of the first and second first conductive patterns 218a, 218b. As a result, the diffusion path length between the neighboring first and second second conductive patterns 228a, 228b is greater than the horizontal distance S2b between the patterns 228a, 228b. Also, the leakage current path length between the first of the first conductive patterns 218a and the second of the second conductive patterns 228b is greater than the horizontal distance S1b between the patterns 218a, 228b. In this manner, the present embodiment offers the features and advantages of the embodiments described above.

In the embodiment of FIG. 6C, sidewall spacers 250 are provided in the upper portions of the first openings 214a, 214b, in the manner described above in connection with the embodiment of FIG. 5, offering the advantages described above.

Figure 8A:
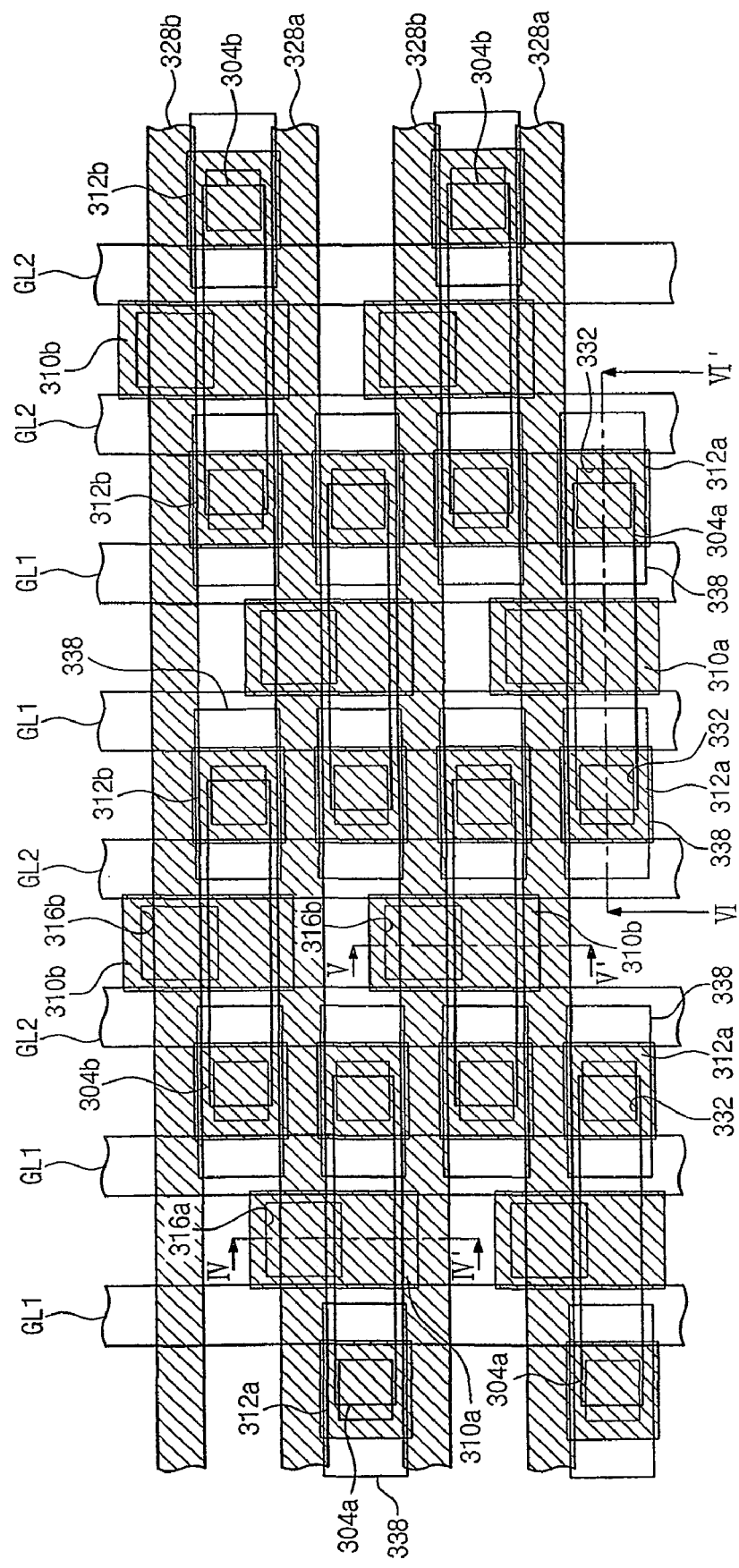
FIG. 8A is a planar top view of a volatile memory semiconductor device including neighboring interconnection lines in the form of bit line patterns coupled to underlying interlayer contact plugs, in accordance with an embodiment of the present invention.

FIG. 8A is a planar top view of a volatile memory semiconductor device including neighboring interconnection lines in the form of bit line patterns coupled to underlying interlayer contact plugs, in accordance with an embodiment of the present invention. FIG. 8B is a cross-sectional view of the device of FIG. 8A, taken along section line IV-IV'. FIG. 8C is a cross-sectional view of the device of FIG. 8A, taken along section line V-V'. FIG. 8D is a cross-sectional view of the device of FIG. 8A, taken along section line VI-VI'. FIGS. 8E and 8F are cross-sectional views of the device of FIG. 8A, taken along section line IV-IV' and V-V' respectively, in accordance with another embodiment of the present invention.

FIGS. 9A'-9C' are cross-sectional views illustrating formation of the device of FIGS. 8A-8F, taken along section line IV-IV', FIGS. 9A"-9C" are cross-sectional views illustrating formation of the device of FIGS. 8A-8F, taken along section line V-V', and FIGS. 9A'''-9C''' are cross-sectional views illustrating formation of the device of FIGS. 8A-8F, taken along section line VI-VI' in accordance with an embodiment of the present invention.

In the embodiment of FIGS. 8A-8F, a volatile memory semiconductor device includes first and second active regions 304a, 304b formed in a semiconductor substrate 300. The first and second active regions 304a, 304b are defined by isolation regions 302 (see FIGS. 9A'-9A'''). Gate line structures 306 are formed on the resulting structure and doped regions 308a, 308b are defined on the active regions between the gate line structures 306. Bit line pads 310a, 310b are formed on the first and second active regions 304a, 304b in contact with doped regions 308a, 308b of the active regions 304a, 304b (see FIGS. 9B'-9B'''). First and second first conductive patterns 318a, 318b, extend through first openings 316a, 316b formed in a first interlayer insulating layer 314 and make contact with the underlying bit line pads 310a, 310b. Upper surfaces of the first and second first conductive patterns 318a, 318b are of a width W1c, and are recessed relative to an upper surface of the first interlayer insulating layer 314 (see FIGS. 9C'-9C'''). In this example, optional barrier layers 321a, 321b are included on the upper surfaces of the first and second first conductive patterns 320a, 320b. First and second second conductive patterns 328a, 328b are formed through a second interlayer insulating layer 324, in contact with the respective first and second first conductive patterns 320a, 320b, in the manner described above. An optional etch stop layer 322 is provided on the upper surface of the second interlayer insulating layer 314. Capping layers 330a, 330b are provided on the first and second second conductive patterns 328a, 328b.

Storage node contacts 336 are formed through the second interlayer insulating layer 324 and the first interlayer insulating layer 314, to make contact with the underlying bit line pads 310a. Lower electrode structures 338 are then formed on the resulting structure, in contact with the upper portion of the storage node contacts 336. A capacitor dielectric layer 340 is formed on the resulting structure, and upper electrode structures 342 are formed on the resulting structure.

Transistor gate lines GL1, GL2 extend in a first horizontal direction of the resulting device, and the first and second second conductive patterns 328a, 328b in this example comprise bit line patterns that extend in a second horizontal direction of the device. While a DRAM-type volatile memory device structure is shown in the above drawings, the same principles are equally applicable to other volatile memory device configurations.

As in the above examples, the width W2c of the first and second second conductive patterns 328a, 328b is less than the width W1c of the first and second first conductive patterns 320a, 320b. As a result, the diffusion path length between the neighboring first and second second conductive patterns 328a, 328b is greater than the horizontal distance S2c between the patterns 328a, 328b. Also, the leakage current path length between the first of the first conductive patterns 320a and the second of the second conductive patterns 328b is greater than the horizontal distance S1bc between the patterns 320a, 328b. In this manner, the present embodiment offers the features and advantages of the embodiments described above.

In the embodiment of FIGS. 8E and 8F, sidewall spacers 350 in the form of line spacers, are provided in the upper portions of the first openings 316a, 316b, in the manner described above in connection with the embodiment of FIG. 5, offering the advantages described above.

Figure 10:
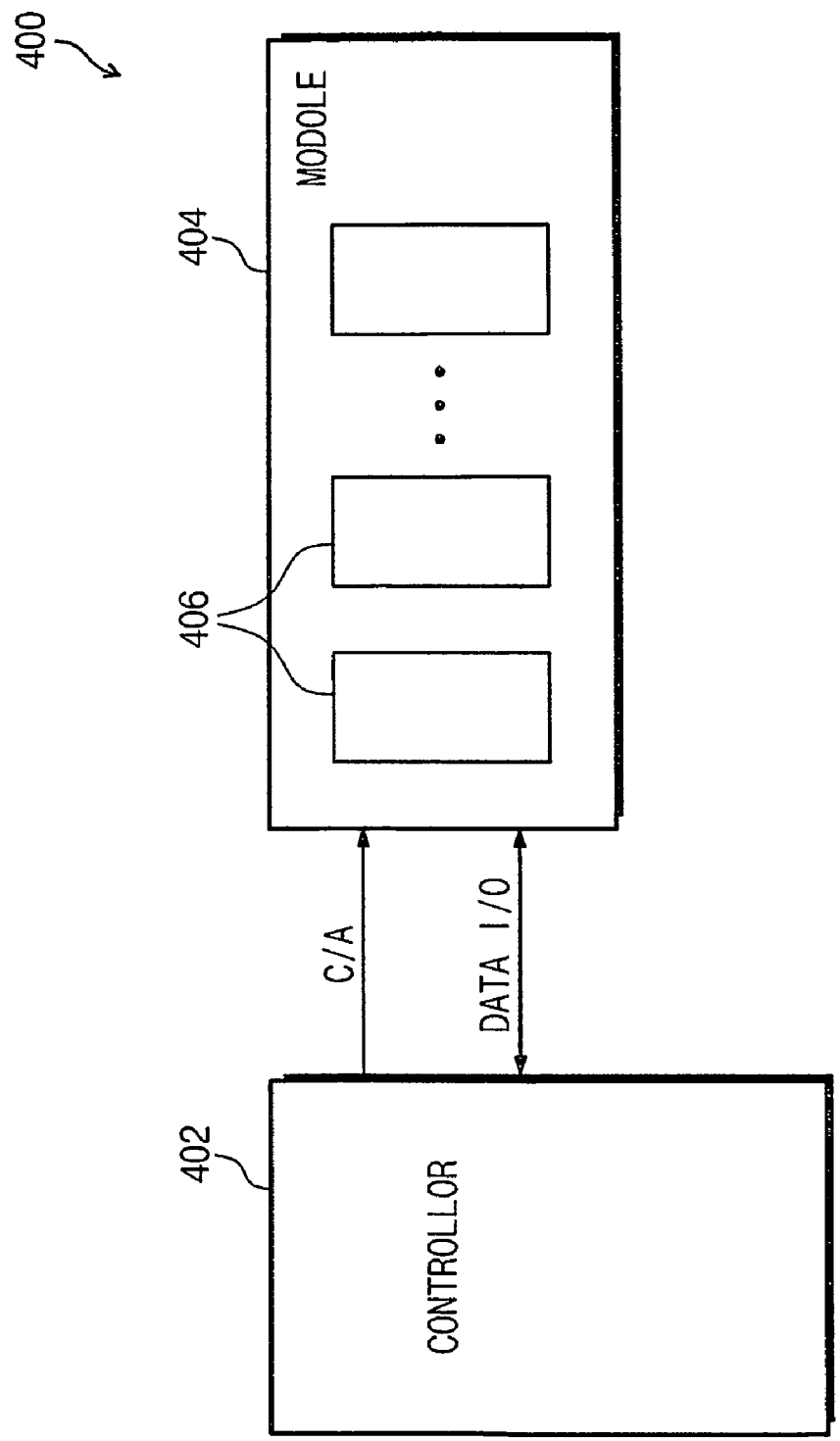
FIG. 10 is a block diagram of a memory system that includes memory devices that employ interlayer contacts in accordance with the embodiments of the present invention.

FIG. 10 is a block diagram of a memory system that includes memory devices that employ interlayer conductive patterns in accordance with the embodiments of the present invention. The memory system 400 includes a memory controller 402 that generates command and address signals C/A and a memory module 404 that includes a plurality of memory devices 406. The memory module 404 receives the command and address signals C/A from the memory controller, and, in response stores and retrieving data DATA I/O to and from at least one of the memory devices 406. Each memory device includes a plurality of addressable memory cells and a decoder that receives the receives the command and address signals, and that generates a row signal and a column signal for accessing at least one of the addressable memory cells during programming and read operations. Each of the components of the memory system 400, including the controller 402, the module electronics 404, and the memory devices 406 can employ the interlayer conductive pattern configurations disclosed herein.

The various embodiments of the present invention disclosed herein can be applied to various semiconductor devices, for example, one of a non-volatile memory device or a volatile memory device such as a DRAM, an SRAM, a NAND-type flash, a NOR-type flash, a PRAM, an MRAM, an RRAM and the like.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
a first insulating layer on an underlying contact region of the semiconductor device, the first insulating layer having an upper surface;
a first conductive pattern in a first opening through the first insulating layer, an upper portion of the first conductive pattern being of a first width, an upper surface of the first conductive pattern being recessed relative to the upper surface of the first insulating layer so that the upper surface of the first conductive pattern has a height relative to the underlying contact region that is less than a height of the upper surface of the first insulating layer relative to the underlying contact region;
a second insulating layer on the first insulating layer;
a second conductive pattern contacting the upper surface of the first conductive pattern, wherein the second conductive pattern is in a second opening through the second insulating layer, a lower portion of the second conductive pattern being of a second width that is less than the first width; and
insulating line spacers between sidewalls of the second opening and sidewalls of the second conductive pattern.

2. The semiconductor device of claim 1 wherein the first conductive pattern includes a conductive barrier layer at an upper portion thereof.

3. The semiconductor device of claim 1 wherein a combined width of the insulating line spacers and a width of the second opening at a bottom portion of the second opening is less than or equal to the first width.

4. The semiconductor device of claim 1 wherein a width of the second opening at a bottom portion of the second opening is greater than the first width.

5. The semiconductor device of claim 1 further comprising a third conductive pattern on the first insulating layer that neighbors the second conductive pattern in a horizontal direction, relative to the underlying first conductive pattern,
wherein a leakage current path between the first conductive pattern and the third conductive pattern along an upper boundary of the first insulating layer has a length that is greater than a horizontal distance between the first conductive pattern and the third conductive pattern.

6. The semiconductor device of claim 1 further comprising a third conductive pattern on the first insulating layer that neighbors the second conductive pattern in a horizontal direction, relative to the underlying first conductive pattern,
wherein a diffusion path between a bottom of the second conductive pattern and a bottom of the third conductive pattern along an upper boundary of the first insulating layer has a length that is greater than a horizontal distance between the second conductive pattern and the third conductive pattern.

7. The semiconductor device of claim 1 further comprising an etch stop layer between the first insulating layer and the second insulating layer.

8. The semiconductor device of claim 1:
wherein the first conductive pattern comprises one of: an interconnect line that extends in a horizontal direction of the semiconductor device, relative to the underlying contact region; and
a conductive plug; and
wherein the second conductive pattern comprises one of: an interconnect line that extends in a horizontal direction of the semiconductor device, relative to the underlying first conductive pattern; and a conductive plug.

9. The semiconductor device of claim 1 further comprising sidewall spacers on sidewalls of the first opening on the upper surface of the first conductive pattern.

10. The semiconductor device of claim 1 wherein the underlying contact region comprises at least one of a substrate, a doped region of a substrate, an epitaxial layer, a gate electrode of a transistor, a silicide region, and a conductive contact.

11. The semiconductor device of claim 1 wherein the device is one of a non-volatile memory device, a volatile memory device, a DRAM, an SRAM, a NAND-type flash memory, a NOR-type flash memory device, a PRAM, an MRAM, and an RRAM.

12. A semiconductor device comprising:
a first insulating layer on an underlying contact region of the semiconductor device, the first insulating layer having an upper surface;
a first conductive pattern in a first opening through the first insulating layer, an upper portion of the first conductive pattern being of a first width;
a second insulating layer on the first insulating layer;
a second conductive pattern through the second insulating layer contacting an upper surface of the first conductive pattern, a lower portion of the second conductive pattern being of a second width that is less than the first width; and
a third conductive pattern on the first insulating layer through the second insulating layer that neighbors the second conductive pattern in a horizontal direction, relative to the underlying first conductive pattern,
wherein a diffusion path between a bottom of the second conductive pattern and a bottom of the third conductive pattern along an upper boundary of the first insulating layer has a length that is greater than a horizontal distance between the second conductive pattern and the third conductive pattern.

13. The semiconductor device of claim 12 wherein an upper surface of the first conductive pattern is recessed relative to the upper surface of the first insulating layer so that the upper surface of the first conductive pattern has a height relative to the underlying contact region that is less than a height of the upper surface of the first insulating layer relative to the underlying contact region.

14. The semiconductor device of claim 12 wherein the first conductive pattern includes a conductive barrier layer at an upper portion thereof.

15. The semiconductor device of claim 12 wherein the second conductive pattern is in a second opening through the second insulating layer.

16. The semiconductor device of claim 15 further comprising an insulating line spacer at sidewalls of the second opening and wherein a combined width of the insulating line spacer and a width of the second opening at a bottom portion of the second opening is less than or equal to the first width.

17. The semiconductor device of claim 15 further comprising an insulating line spacer at sidewalls of the second opening and wherein a combined width of the insulating line spacer and a width of the second opening at a bottom portion of the second opening is greater than the first width.

18. The semiconductor device of claim 15 wherein a leakage current path between the first conductive pattern and the third conductive pattern along an upper boundary of the first insulating layer has a length that is greater than a horizontal distance between the first conductive pattern and the third conductive pattern.

19. The semiconductor device of claim 12 further comprising an etch stop layer between the first insulating layer and the second insulating layer.

20. The semiconductor device of claim 12:
wherein the first conductive pattern comprises one of: an interconnect line that extends in a horizontal direction of the semiconductor device, relative to the underlying contact region; and
a conductive plug; and
wherein the second conductive pattern comprises one of: an interconnect line that extends in a horizontal direction of the semiconductor device, relative to the underlying first conductive pattern; and a conductive plug.

21. The semiconductor device of claim 12 further comprising sidewall spacers on sidewalls of the first opening on the upper surface of the first conductive pattern.

22. The semiconductor device of claim 12 wherein the underlying contact region comprises at least one of a substrate, a doped region of a substrate, an epitaxial layer; a gate electrode of a transistor, a silicide region, and a conductive contact.

* * * * *